(12) United States Patent
Stanton

(10) Patent No.: US 7,401,010 B2
(45) Date of Patent: Jul. 15, 2008

(54) METHODS OF FORMING RADIATION-PATTERNING TOOLS; CARRIER WAVES AND COMPUTER READABLE MEDIA

(75) Inventor: William A. Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 710 days.

(21) Appl. No.: 10/953,982

(22) Filed: Sep. 28, 2004

(65) Prior Publication Data

US 2005/0049839 A1   Mar. 3, 2005

Related U.S. Application Data

(63) Continuation of application No. 10/341,691, filed on Jan. 13, 2003, now Pat. No. 6,807,519.

(51) Int. Cl.
*G06F 17/50* (2006.01)
*G03F 7/20* (2006.01)

(52) U.S. Cl. .................... 703/2; 703/6; 430/5

(58) Field of Classification Search ............ 703/2, 703/6; 250/204; 348/308; 716/19–21; 430/5
See application file for complete search history.

(56) References Cited

U.S. PATENT DOCUMENTS

| | | | |
|---|---|---|---|
| 5,636,002 A | | 6/1997 | Garofalo |
| 6,251,546 B1 | | 6/2001 | Cirelli et al. |
| 6,350,977 B2 | * | 2/2002 | Taoka .................. 250/204 |
| 6,807,519 B2 | * | 10/2004 | Stanton .................. 703/2 |
| 2002/0035461 A1 | | 3/2002 | Chang et al. |
| 2003/0027366 A1 | | 2/2003 | Dulman et al. |
| 2003/0103189 A1 | | 6/2003 | Neureuther et al. |
| 2003/0128347 A1 | | 7/2003 | Case et al. |

OTHER PUBLICATIONS

Nakajo et al, "Auxiliary pattern generation to cancel unexpected images at sidelobe overlap regions in attenuated phase shift masks", SPIE, 1999, pp. 214-221.*
"*Chemically Amplified Photoresists*", IBM: http://www.almaden. ibm.com/st/projects/sub100nm/objectives/ca/, no date.
"Imaging of photogenerated acid in a chemically amplified photoresin"; S. J. Bokofsky et al.; 1998 American Insitute of Physics, vol. 73, No. 3, Jul. 20, 1998, pp. 408-410.

* cited by examiner

*Primary Examiner*—Thai Phan
(74) *Attorney, Agent, or Firm*—Wells St. John P.S.

(57) ABSTRACT

The invention includes a method for placement of sidelobe inhibitors on a radiation-patterning tool. Elements of the tool are represented by design features in a modeling domain. The modeling domain is utilized to generate vectors spanning between edges of design features within a threshold spatial distance of one another. Locations of vector midpoints are identified. The locations are utilized in identifying areas where sidelobe overlap is likely. The areas are shifted from the modeling domain to a real domain, and in the real domain correspond to regions of the tool where sidelobe overlap is likely to occur. Sidelobe inhibitors are formed across at least some of the identified regions of the tool. The invention includes computer readable code that can enable a computer to determine locations for placement of the sidelobe inhibitors.

13 Claims, 12 Drawing Sheets
(3 of 12 Drawing Sheet(s) Filed in Color)

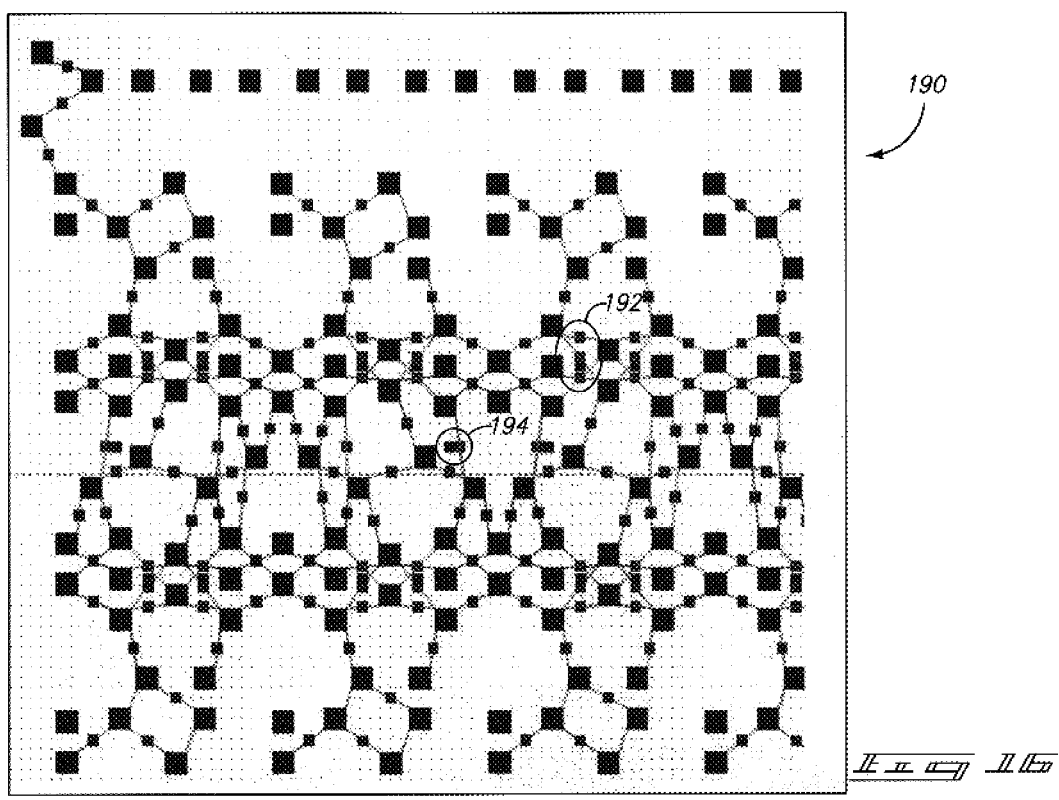

METHODS OF FORMING RADIATION-PATTERNING TOOLS; CARRIER WAVES AND COMPUTER READABLE MEDIA

RELATED PATENT DATA

This patent resulted from a continuation application of U.S. patent application Ser. No. 10/341,691, which was filed Jan. 13, 2003, and which is now U.S. Pat. No. 6,807,519.

TECHNICAL FIELD

The invention pertains to methods of forming radiation-patterning tools. In particular aspects the invention pertains to computer readable code that can enable a computer to determine locations for placement of sidelobe inhibitors. The code can be, for example, on a computer readable media or in a carrier wave.

BACKGROUND OF THE INVENTION

Photolithography is commonly used during formation of integrated circuits on semiconductor wafers. More specifically, a form of radiant energy (such as, for example, ultraviolet light) is passed through a radiation-patterning tool and onto a radiation-sensitive material (such as, for example, photoresist) associated with a semiconductor wafer. The radiation-patterning tool can be referred to as a photomask or a reticle. The term "photomask" traditionally is understood to refer to masks which define a pattern for an entirety of a wafer, and the term "reticle" is traditionally understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the terms "reticle" and "photomask" are utilized with their traditional meanings.

Radiation-patterning tools contain light restrictive regions (for example, totally opaque or attenuated/half-toned regions) and light transmissive regions (for example, totally transparent regions) formed in a desired pattern. A grating pattern, for example, can be used to define parallel-spaced conductive lines on a semiconductor wafer. As discussed previously, the wafer is provided with a layer of radiation-sensitive material (such as, for example, photosensitive resist material, which is commonly referred to as photoresist). Radiation passes through the radiation-patterning tool onto the layer of photoresist and transfers a pattern defined by the radiation-patterning tool onto the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials on the wafer proximate the photoresist.

Advances in semiconductor integrated circuit performance have typically been accompanied by a simultaneous decrease in integrated circuit device dimensions and a decrease in the dimensions of conductor elements which connect those integrated circuit devices. The demand for ever smaller integrated circuit devices brings with it demands for ever-decreasing dimensions of structural elements, and ever-increasing requirements for precision and accuracy in radiation patterning.

FIG. 1 shows a flow chart illustrating a typical process utilized for creating a pattern for a radiation-patterning tool. At an initial step 10, a preliminary design is created for the radiation-patterning tool and verified. The creation of the design begins with provision of a desired pattern which is ultimately to be formed in photoresist. Subsequently, elements are developed for the radiation-patterning tool to roughly produce the desired pattern on photoresist from radiation passed through the radiation-patterning tool. The elements form a rough correspondence to the desired pattern in that the first approximation of the elements largely ignores effects of interference on radiation passing through the radiation-patterning tool.

After the design is believed to be complete, (i.e., once it is believed that all patterned features which are to be patterned in photoresist with the radiation-patterning tool are represented by elements in the design) the design is submitted to a verification process to confirm that the design is complete.

After the design has been created and verified, it is subjected to optical proximity correction (shown as step 20 in FIG. 1). The optical proximity correction takes into account various interference factors that influence radiation passing through a radiation-patterning tool (i.e., constructive and destructive interference effects that result from passing radiation through patterns having dimensions on the same order as the wavelength of the radiation, or smaller). The optical proximity correction can be utilized to correct all parts of the design, or only some parts of the design. In other words, the optical proximity correction can be applied to only some portions of a design, while other portions are not optical proximity corrected. Typically there will be a verification step following the optical proximity correction.

The steps of generating a design from a desired pattern which is to be provided in photoresist, verification of the design, optical proximity correction, and verification of the correction, are typically accomplished primarily through the use of software. A suitable software package which can be utilized for one or more of the steps is HERCULES™/TAURUS OPC™, which is available from Synopsys Corporation™.

The optical proximity correction creates a dataset which is subsequently translated into a pattern formed on a radiation-patterning tool. The process of translating the dataset into a pattern on the radiation-patterning tool is frequently referred to as taping the pattern onto the radiation-patterning tool. In such context, the terms "tape" and "tape out" refer to a process of transferring the dataset to appropriate hardware which writes a pattern represented by the dataset onto the radiation-patterning tool. The process of writing onto the radiation-patterning tool can be accomplished by, for example, laser writing and/or electron-beam writing methodologies. The step of taping the pattern onto the radiation-patterning tool is shown in FIG. 1 as step 30.

After the pattern has been formed on the radiation-patterning tool, the tool can be utilized for patterning radiation in semiconductor fabrication processes. FIG. 2 illustrates an exemplary apparatus 40 in which a radiation-patterning tool is utilized for patterning radiation. Apparatus 40 comprises a lamp 42 which generates radiation 44. Apparatus 40 further comprises a radiation-patterning tool 46 through which radiation 44 is passed. A semiconductor substrate 48 having a radiation-sensitive material 50 thereover is illustrated associated with apparatus 40. The radiation passing through radiation-patterning tool 46 impacts radiation-sensitive material 50 to form a pattern within the radiation-sensitive material.

The process of forming a pattern in a radiation-sensitive material with a radiation-patterning tool can be referred to as a printing operation.

Radiation-patterning tool 46 typically comprises an opaque material (such as chrome) over a transparent material (such as a glass). Radiation-patterning tool 46 has a front side where the pattern is formed as features (or windows) extending through the opaque material, and has a back side in opposing relation to the front side. The shown radiation-patterning tool has two opposing sides 45 and 47, and in practice one of the two sides would be the front side (typically side 45) and the other would be the back side. In some applications features can be printed on both the front side and back side of the radiation-patterning tool.

As discussed above, radiation-patterning tool 46 will typically have a pattern with dimensions on the order of the wavelength of the radiation passing through the radiation-patterning tool, or smaller. Accordingly, various interference effects can occur as the radiation passes through the radiation-patterning tool so that the radiation exiting the radiation-patterning tool will transfer a pattern somewhat different than the pattern of the radiation-patterning tool. Such is illustrated diagrammatically in FIG. 3. Specifically, FIG. 3 illustrates an exemplary pattern 60, which can be desired to be formed in a radiation-sensitive material, and illustrates an approximation of a pattern 70 which would be formed in a radiation-patterning tool to generate the pattern 60. Pattern 70 is referred to as an approximation because the pattern is a qualitative representation of the type of pattern utilized in the radiation-patterning tool for generating pattern 60, rather than a quantitative representation.

The FIG. 1 process can, for example, start with a pattern identical to pattern 60 being provided at the design step (10) of the radiation-patterning tool fabrication process, and such design would then be converted to the shape 70 during the optical proximity correction (20) step.

FIG. 4 illustrates an exemplary design which can be desired to be formed in a radiation-sensitive material 80, and illustrates elements in a radiation-patterning tool 84 utilized to create such design.

Radiation-sensitive material 80 is illustrated in top view, and the design formed within the material comprises a plurality of repeating units 82. The shown units 82 are circular in patterned dimension, and can be utilized, for example, in forming contact openings. One of the shown units is centered around a location 83, and another of the units is centered around a location 85.

Radiation-patterning tool 84 comprises a plurality of repeating elements 86. The elements 86 are in a one-to-one correspondence with the units 82 formed in the radiation-sensitive material. Further, each of elements 86 is approximately square in shape. In operation, radiation is passed through radiation-patterning tool 84 to form the pattern of printed images 82 on radiation-sensitive material 80. Regions 86 of the radiation-patterning tool can be either more transparent to radiation than surrounding regions of the radiation-patterning tool, or can be less transparent, depending on whether the radiation-sensitive material corresponds to a positive or negative material. If elements 86 are more transmissive to radiation than surrounding regions, the elements 86 can effectively be windows which allow radiation to pass through those specific regions of the radiation-patterning tool.

In particular aspects of the prior art, printed images 82 correspond to regions where light has passed through windows 86 of radiation-patterning tool 84. If windows 86 have dimensions on the order of the wavelength of the light passing through the windows, there can be sidelobes of energy 88 extending around each of features 82. The sidelobes are commonly referred to as sombreros. The energy within the sombreros is generally too low to form a printed feature within the radiation-sensitive material 80. However, if two or more sidelobes converge near one another, they can form a printed feature at the location of the convergence. Regions 90 and 92 illustrate locations where four sidelobes converge near one another, and accordingly illustrate locations where printed features can undesirably occur due to the convergence of the sidelobes.

Sidelobe convergence is described in additional detail with reference to FIGS. 5-7. Referring initially to FIG. 5, electric field strength of light passing through a window 86 to form a feature 82 centered around location 83 is illustrated (the figure is for diagrammatic purposes only, and not quantitative). A large positive field strength occurs at location 83, and negative sidelobes occur at locations 88. The large positive field strength can be referred to as a primary lobe.

The effect induced by radiation impacting radiation-sensitive material 80 is actually proportional to the intensity of the radiation, rather than the field strength, and the intensity is a function of the square of the field strength. FIG. 6 is a diagrammatic graph of the intensity of the radiation utilized to pattern the feature centered around location 83. Since the intensity is the square of the field strength values, the sidelobes have a positive value, as does the primary lobe at location 83. Accordingly, if the magnitude of sidelobes 88 is sufficient, the sidelobes can generate printed features in the radiation-sensitive material 80. However, the magnitude of the sidelobes generated from light passing through a single window is typically too small to form a printed feature.

FIG. 7 diagrammatically illustrates the additive effect of a sidelobe formed from radiation centered around location 83, and a sidelobe formed from radiation center on location 85. The radiation formed around location 85 is identical to that formed around location 83, and accordingly a main lobe of radiation occurs at location 85 which is about identical in magnitude to the main lobe occurring around location 83. However, since a sidelobe from the radiation around location 85 overlaps a sidelobe from around location 83, the two sidelobes combined to form a lobe 94 having increased intensity relative to the main lobes at locations 83 and 85. Lobe 94 results from combination of sidelobes from two adjacent patterns of radiation, and the concept illustrated in FIG. 7 can be extended to combinations of three or more proximate patterns of radiation. Accordingly, a lobe formed from the combination of the sidelobes can grow significantly in intensity relative to the main lobes occurring at the centered regions of the patterns, and eventually the lobe formed from the combined sidelobes can have sufficient intensity to generate a printed feature.

Various techniques have been developed for identifying locations where sidelobes may combine to form a printed feature. Once such locations are identified, a radiation-patterning tool can be modified to prevent the undesired combination of sidelobes. For instance, FIG. 8 illustrates a portion of a mathematical construct 98 utilized to form radiation-patterning tool 84 (FIG. 4). Construct 98 comprises comprising four design features 101 which correspond to the elements 86 of radiation-patterning tool 84, and illustrates a prior art method for identifying a location where sidelobes may combine during utilization of the radiation-patterning tool. Construct 98 may correspond to a mathematical model formed at step 10 of the FIG. 1 process.

A calculation is performed on the spatial characteristics of design features 101, and such calculation can be considered to create a polygon 100 extending between the features 101. It is to be understood that the calculation is occurring in a mathematical domain during development of a pattern for a radiation-patterning tool, and accordingly the polygon 100 is not a real feature. The shown polygon is a rectangle extending from vertices of adjacent elements. The rectangle is subsequently utilized to determine the location of a sidelobe inhibitor 102. The location is initially determined as part of the mathematical model, but eventually the location is shifted to the real domain and an actual sidelobe inhibitor is formed at a real location of a radiation-patterning tool corresponding to the location 102 of the mathematical domain. The sidelobe inhibitor is utilized to prevent formation of an undesired printed feature from occurring at the location where sidelobes from radiation passing through the elements 86 (FIG. 4) converge.

FIG. 9 shows a portion of a radiation-patterning tool 84 identical to the tool described with reference to FIG. 4, except that a sidelobe inhibitor 103 is formed to prevent sidelobes of radiation passing through windows 86 from combining. Inhibitor 103 has length and width dimensions of "X" and "Y". Such dimensions will typically be about ½ of the wavelength of radiation passed through tool 84 to form the pattern in the radiation-sensitive material. Inhibitor 103 can be formed by etching into an opaque material associated with tool 84 to form a region where radiation will be in phase with the main lobe of FIG. 5, and thus out of phase relative to other portions of sidelobe radiation. Such can cause destructive interference which ultimately cancels a significant amount of intensity from the combined sidelobes. The inhibitor 103 can thus correspond to a phasing region.

FIG. 10 is a color representation of a construct 97 showing actual results obtained from a prior art routine utilized to calculate placement locations for sidelobe inhibitors. Construct 97 corresponds to a mathematical model describing locations for placements of elements (shown as blue squares) and sidewall inhibitors (red blocks). Construct 97 also contains the polygons generated by the sidelobe placement routine (brown lines). The calculations utilized for determining the location of the sidelobe inhibitors would typically occur between steps 10 and 20 of the FIG. 1 process. In other words, the calculations would occur after a rough mathematical model is created for placement of elements in a radiation-patterning tool, and before optical proximity correction. The elements are actually represented as spatial information (also referred to herein as design features) in the mathematical model.

The placement routine described with reference to FIG. 10 will occasionally misidentify a location where sidelobe interference occurs. This can lead to placement of a sidelobe inhibitor at the wrong location. Also, the methodology described with reference to FIG. 10 will occasionally not recognize multiple discrete locations where sidelobe interference will occur if the locations are too close to one another. Such can result in a single sidelobe inhibitor being placed across an average of several locations where sidelobe combinations occur, rather than being placed at each discrete location where the combinations occur. This can result in some locations not having an appropriate sidelobe inhibitor provided.

It would be desirable to develop new methodology for identifying locations of radiation-patterning tools where sidelobe inhibitors are to be provided.

SUMMARY OF THE INVENTION

In one aspect, the invention includes a method for placement of sidelobe inhibitors on a radiation-patterning tool. Elements are defined which will be formed in the radiation-patterning tool. A mathematical description of the relative spatial orientations of the elements is formed. The elements are represented in the mathematical description by design features. The mathematical description is defined as a modeling domain, and the elements are defined as a real domain. The modeling domain is utilized to generate vectors spanning between edges of design features within a threshold spatial distance of one another. Locations of vector midpoints are identified, and such locations can be referred to as first locations. Locations can also be identified where a threshold number of vector midpoints converge to within an overlap distance, and such locations can be referred to as second locations. The threshold number of vectors can be, for example, two. The first locations and/or second locations are shifted from the modeling domain to the real domain to identify regions of the tool where sidelobe overlap will occur. Sidelobe inhibitors are formed across the identified regions of the tool. The generation of the vectors can occur before optical proximity correction of the design features.

In particular aspects the invention pertains to computer readable code that can enable a computer to determine locations for placement of sidelobe inhibitors. The code can be, for example, on a computer readable media or in a carrier wave.

BRIEF DESCRIPTION OF THE DRAWINGS

Preferred embodiments of the invention are described below with reference to the following accompanying drawings.

The patent or application file contains at least one drawing executed in color. Copies of this patent or patent application publication with color drawing(s) will be provided by the Office upon request and payment of the necessary fee.

FIG. 15 comprises a plurality of design features shown as blue blocks, and corresponding to elements which will be ultimately formed in a radiation-patterning tool. The design features of FIG. 15 are identical to design features shown with reference to the prior art construction of FIG. 10.

FIG. 16 is a color drawing comparing the results of the methodology of the present invention shown in FIG. 15 with the prior art methodology of FIG. 10, and showing that the methodology of the present invention has correctly identified locations for numerous sidelobe inhibitors which were not correctly identified by the prior art methodology.

DETAILED DESCRIPTION OF THE PREFERRED EMBODIMENTS

The invention includes new methodology which can be quick, efficient and accurate for determining placement of sidelobe inhibitors on radiation-patterning tools. In particular aspects, the methodology assumes that contacts will be adjacent before significant sidelobes develop. This assumption can be utilized in a heuristic routine using Design Rule Checks (DRC) in order to determine the location of the sidelobes. Methodology of the present invention can account for all of the two, three or four interaction contact scenarios of radiation-patterning tool design, and can significantly reduce the placement time of sidelobe inhibitors relative to methods which simulate light patterns passing through a radiation-patterning tool in order to determine regions of undesired sidelobe interaction. Methodology of the present invention can be used for any pitch between contacts, and can be utilized with a high degree of speed and accuracy. A method of the present invention can be utilized to complete calculations for determining problematic sidelobe interactions for a 256M DRAM in less than an hour, whereas prior art methods can take up to a day or more to determine such problematic sidelobe interactions.

Figure 8:
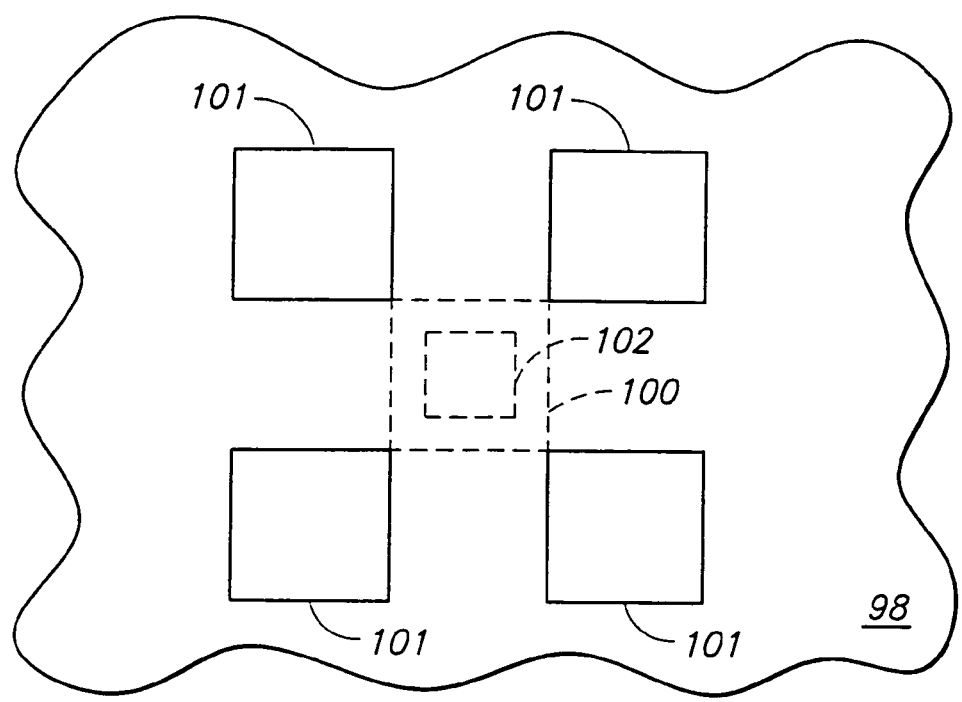
FIG. 8 is a diagrammatic top view of a mathematical construction illustrating a prior art process for determining a location of a sidelobe inhibitor.
Figure 9:
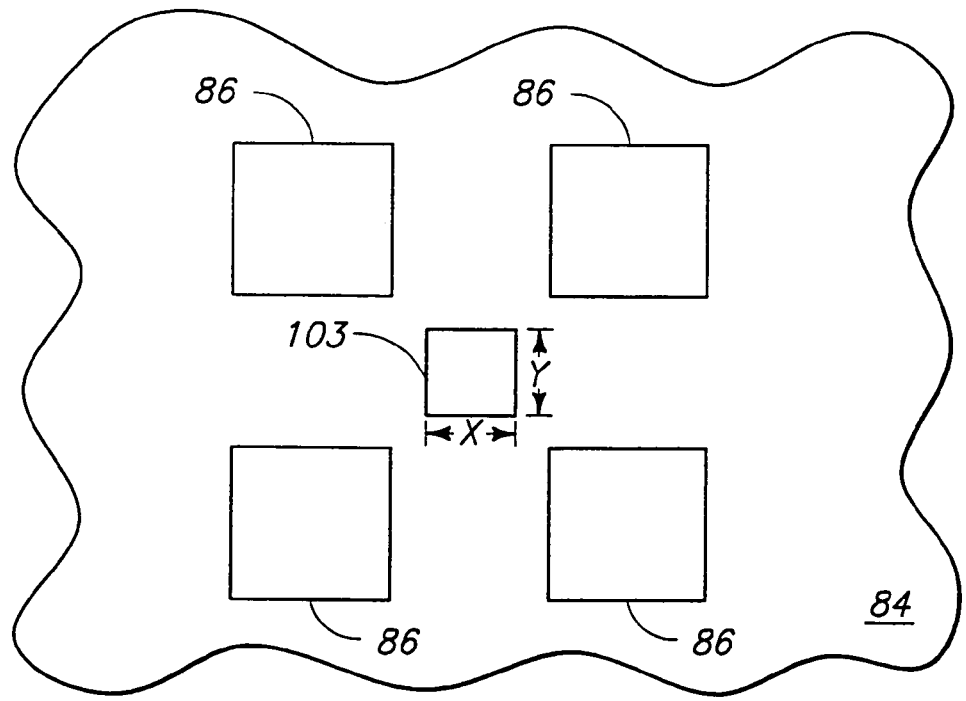
FIG. 9 is a diagrammatic top view of a prior art radiation-patterning tool comprising a sidelobe inhibitor.
Figure 11:
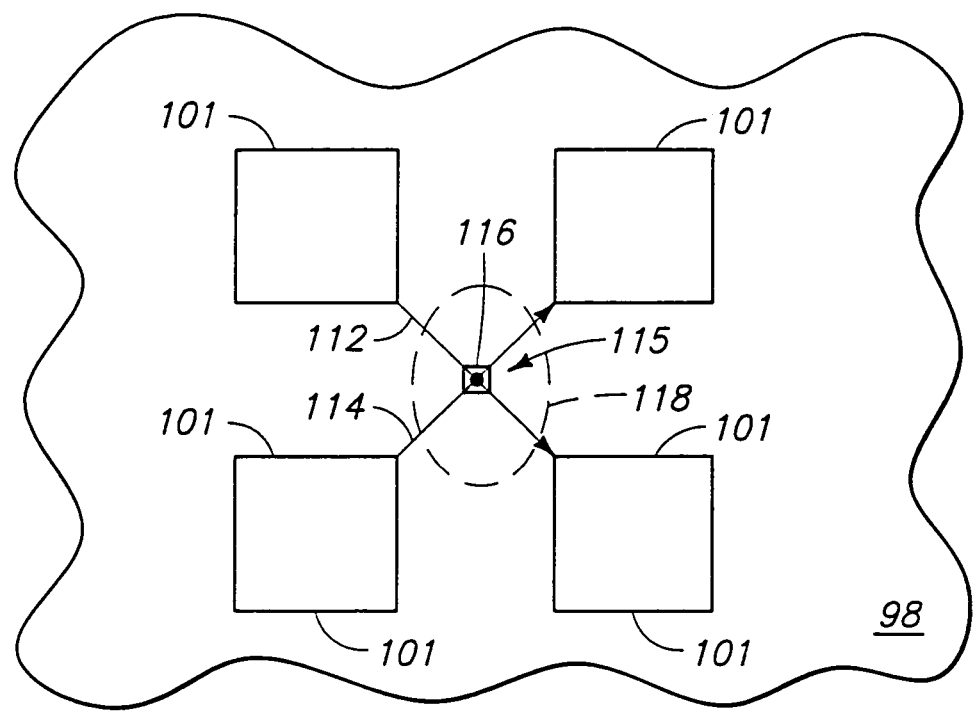
FIG. 11 is a diagrammatic top view of a mathematical construction illustrating a process of the present invention for determining placement of sidelobe inhibitors.

FIG. 11 illustrates a method of the present invention relative to the mathematical model 98 described previously with reference to FIG. 8. The model of FIG. 11 comprises the design features 101 described previously with reference to FIG. 8. Exemplary methodology of the present invention determines which of the features 101 are adjacent one another and within a threshold spatial distance of one another. The design features 101 will ultimately correspond to elements taped to a radiation-patterning tool, and the radiation-patterning tool will then be utilized for printing a pattern in a radiation-sensitive material. The printing will involve passing light of an appropriate wavelength through the radiation-patterning tool. The threshold spatial distance utilized in identifying design features in methodology of the present invention can be related to the wavelength of light utilized in the printing operation. For instance, the threshold spatial distance can be from about ½ of such wavelength to about the wavelength.

An algorithm is utilized to generate vectors spanning between edges of design features which are within the threshold spatial distance of one another. The generated vectors define a vector space. Exemplary vectors are illustrated in FIG. 11 as vectors 112 and 114. Each vector represents a pair of sidelobes extending within a space between a pair of elements which are close enough to one another for the sidelobes to interact with one another. Again, it is emphasized that the structure 98 is not an actual structure, but rather is a mathematical construct utilized in the development of elements for a radiation-patterning tool. Accordingly, the vectors do not extend between actual elements, but instead extend between design features corresponding to the elements. It is noted that the vectors are an approximation for sidelobes generated by radiation passing through elements, and not a simulation of such sidelobes.

The next step of the present invention is to determine first locations in the modeling domain of construct 98 corresponding to vector midpoints. The first locations can be utilized directly as corresponding to regions of a radiation-patterning tool where undesired sidelobe overlap occurs. Additionally, and/or alternatively, the first locations can be utilized to determine second locations where a threshold number of vectors converge to within a threshold distance of one another. Each vector corresponds to a pair of overlapping sidelobes, and accordingly a single vector indicates a potential problem of sidelobe overlap. A pair of converging vectors indicates four sidelobes proximate one another, which is an area where a problem associated with sidelobe overlap is likely.

Construct 98 also has a pair of overlapping vectors 112 and 114, and accordingly indicates a potential problem area for sidelobe interaction at the location 115 where midpoints of the vectors 112 and 114 converge. In particular aspects, the present invention includes an algorithm which determines if the vector midpoints converge to within a threshold distance of one another. Although overlapping vector midpoints clearly converge, there can also be instances where vector midpoints converge to within a predefined threshold distance even though the vectors do not overlap. For instance, region 118 can correspond to an exemplary threshold distance of convergence for midpoints of the illustrated vectors.

In applications in which overlapping vectors are the only converging vectors, and in which the vectors overlap at their midpoints, the location which is ultimately to have a sidelobe inhibitor can be considered to correspond to the location in construct 98 where the vectors overlap. However, if non-overlapping vectors are within the group of converging vectors, or if the vectors overlap at locations other than their midpoints, then the location of sidelobe interference from the converging vectors will typically be determined as an average of the various midpoint locations of the vectors having midpoints contained within the threshold distance of one another.

The threshold distance for determining convergence can be considered to be a diameter of the shown circular region 118, and can be proportional to a wavelength of light ultimately utilized for printing with a radiation-patterning tool formed from mathematical construct 98. Such diameter can be, for example, less than or equal to about one-half of the wavelength.

After the sidelobe overlap regions are located within construct 98, the construct is utilized to form a radiation-patterning tool. Such radiation-patterning tool comprises elements corresponding to design features 101, and also comprises sidelobe inhibitors (such as phasing regions) formed across at least some of the regions of the tool corresponding to the first and sidelobe overlap locations identified with mathematical construct 98, (with the first sidelobe overlap locations being, as discussed above, midpoints of non-converging vectors and the second sidelobe overlap locations being locations where a threshold number of midpoints converge). Typically, sidelobe inhibitors will be formed across at least all of the regions of the tool corresponding to second sidelobe overlap locations identified with mathematical construct 98. The sidelobe inhibitors formed on the radiation-patterning tool can be considered to be formed at locations shifted from the modeling domain 98 to the real domain corresponding to the tool. An exemplary location of a sidelobe inhibitor 116 is shown in the modeling domain 98.

Figure 1:
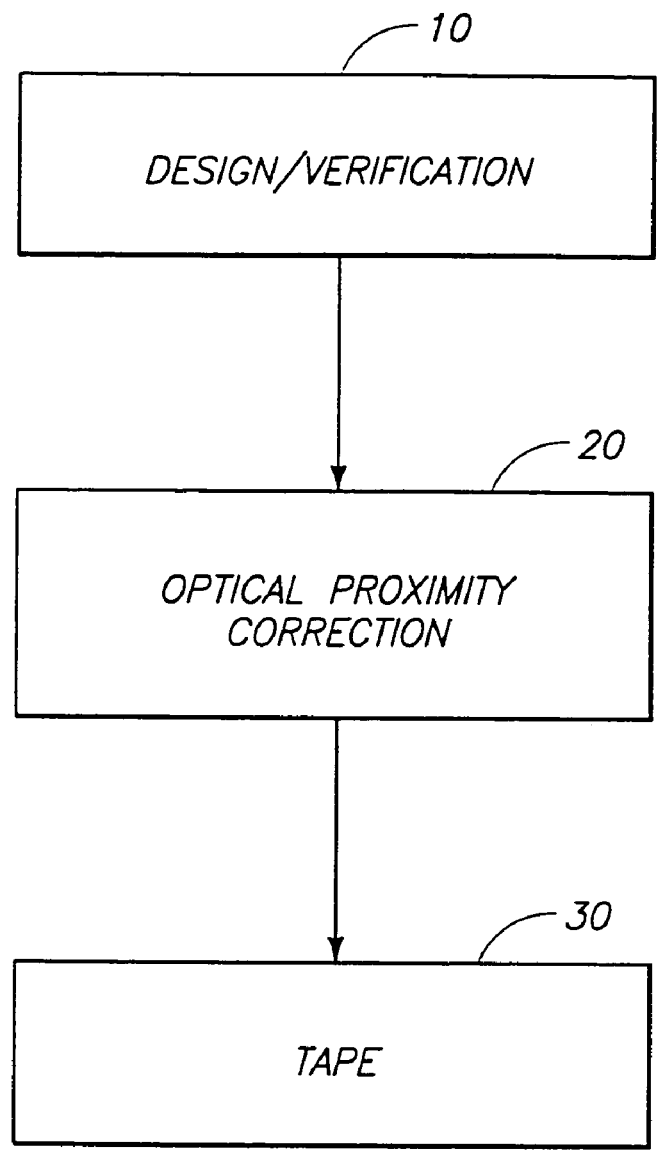
FIG. 1 is a flow chart diagram of a prior art method of forming a radiation-patterning tool.
Figure 2:
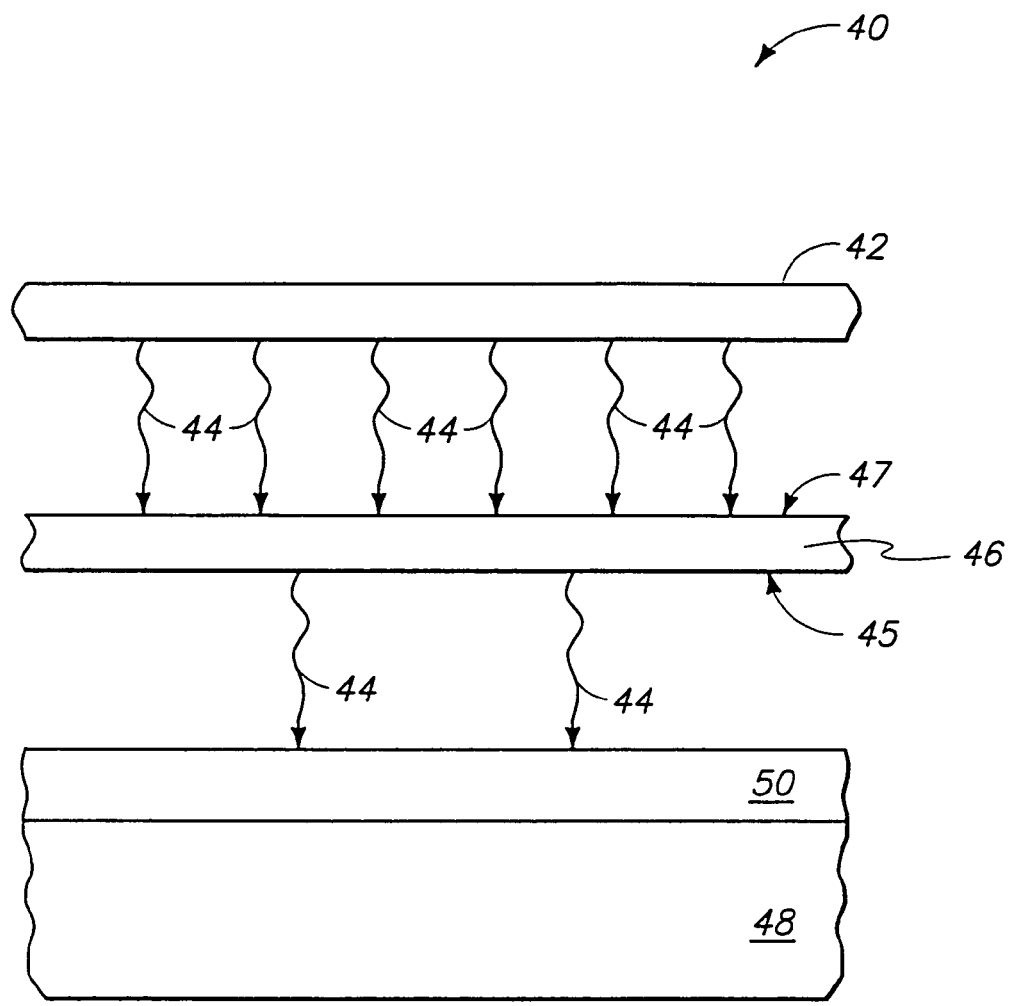
FIG. 2 is a diagrammatic, cross-sectional view of a prior art apparatus utilized in printing a pattern to a radiation-sensitive material utilizing a radiation-patterning tool.
Figure 3:
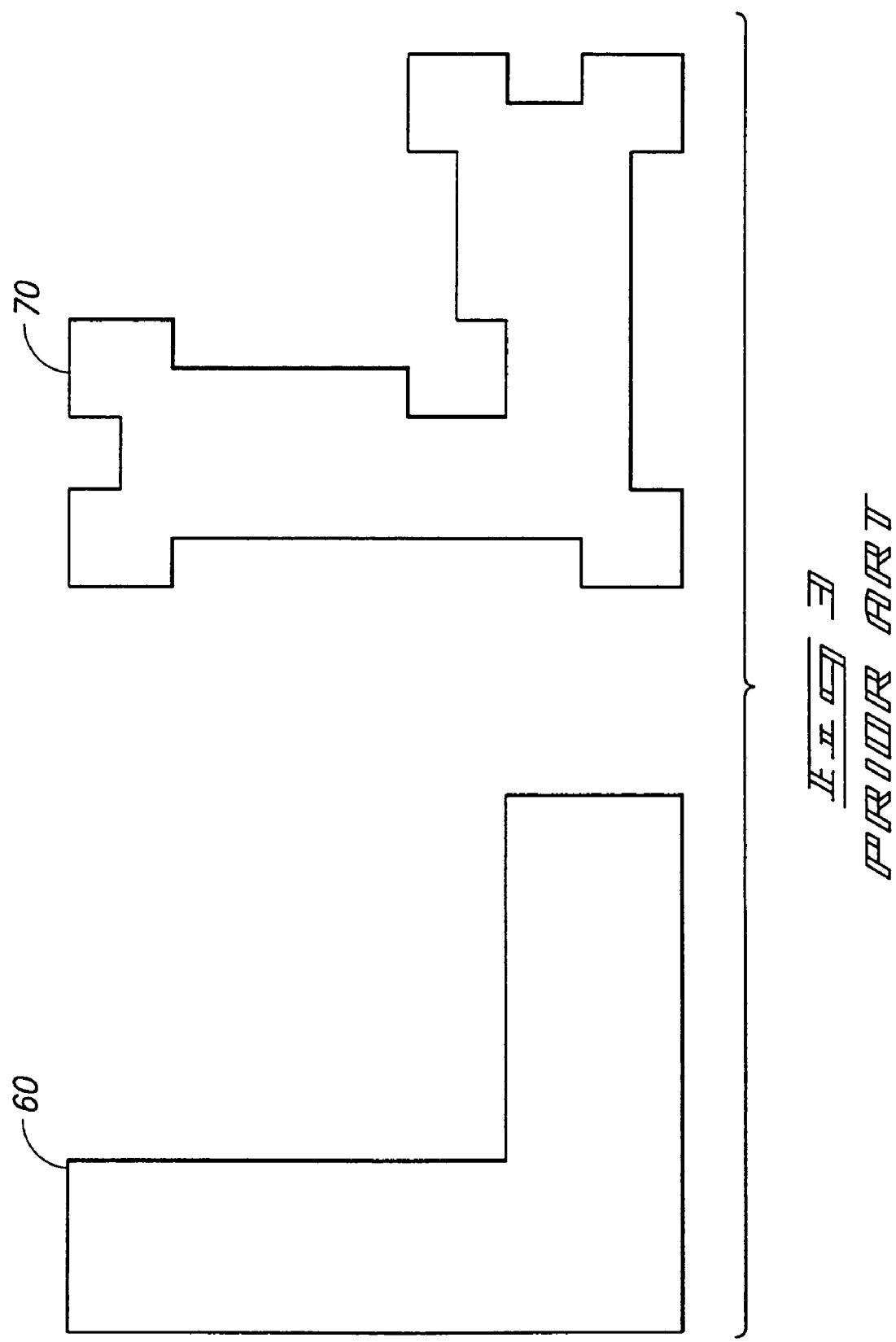
FIG. 3 is a diagrammatic view of a desired pattern and an element utilized for producing the pattern, in accordance with prior art methodologies.
Figure 4:
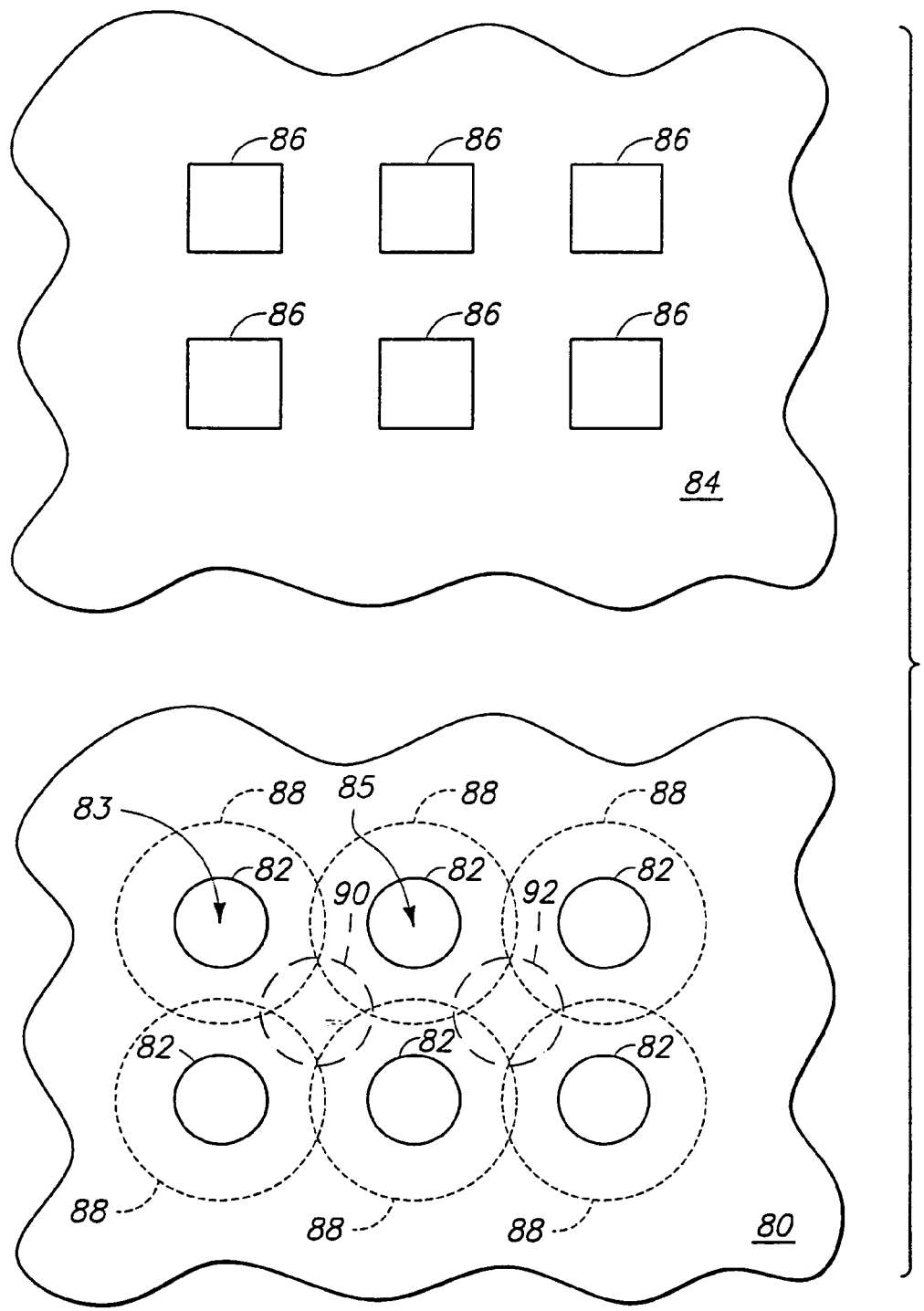
FIG. 4 is a top view of a prior art pattern in a radiation-sensitive material, together with a top view of a prior art radiation-patterning tool which can be utilized for forming the pattern.
Figure 5:
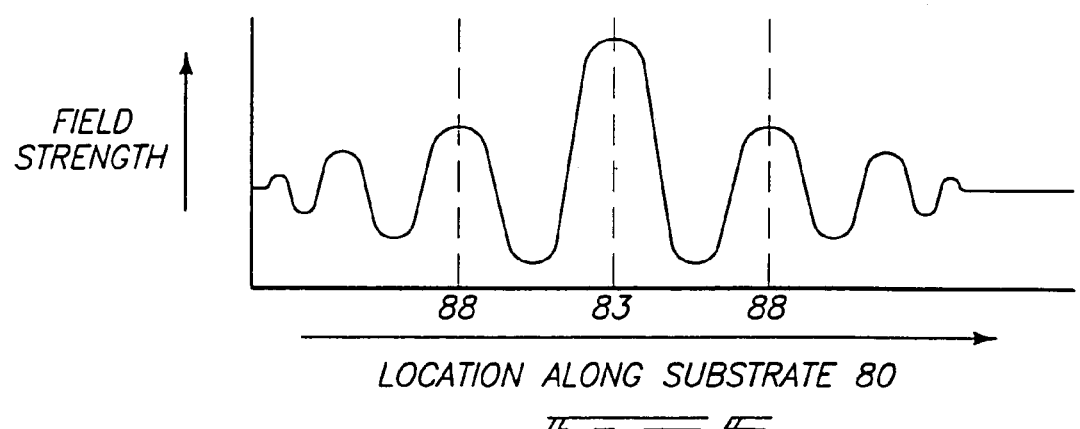
FIG. 5 is a graphical illustration of prior art field strength versus location along a substrate for an electrical field associated with radiation passing through a radiation-patterning tool.
Figure 6:
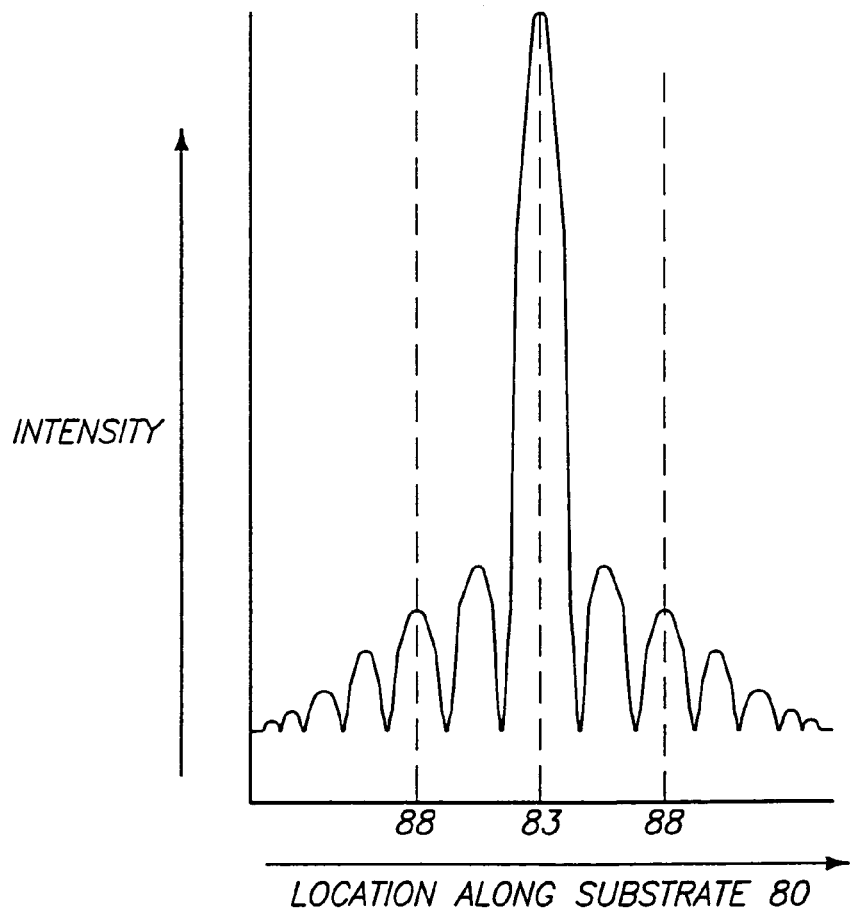
FIG. 6 is a graphical illustration of prior art intensity versus location along the substrate for the electrical field of FIG. 5.
Figure 7:
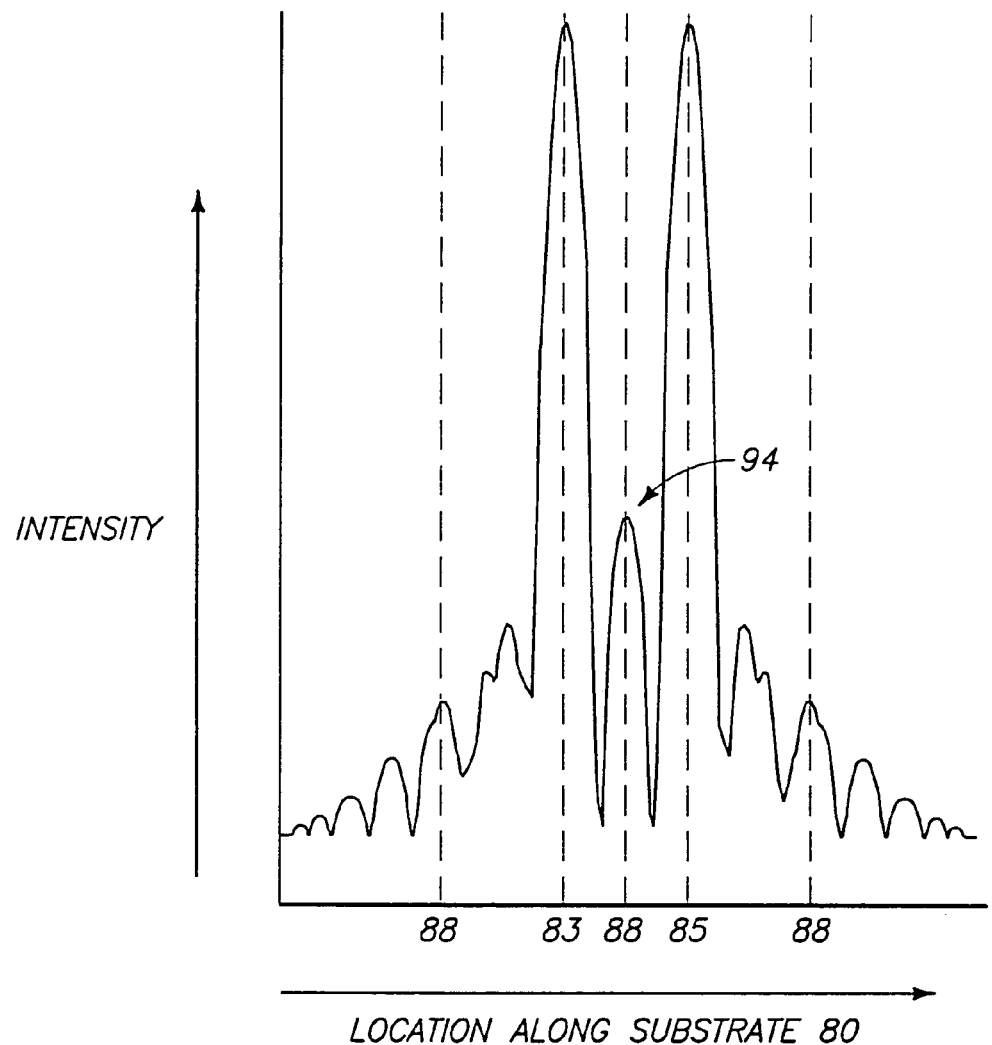
FIG. 7 is a graphical illustration of prior art intensity versus location along a substrate illustrating a combination of intensities from two electrical fields passing through elements proximate one another in a radiation-patterning tool.

The mathematical manipulations of generating the vectors, identifying vector midpoints, and identifying regions where threshold numbers of vector midpoints converge are typically conducted prior to the optical proximity correction described in the flow chart diagram of FIG. 1.

Figure 12:
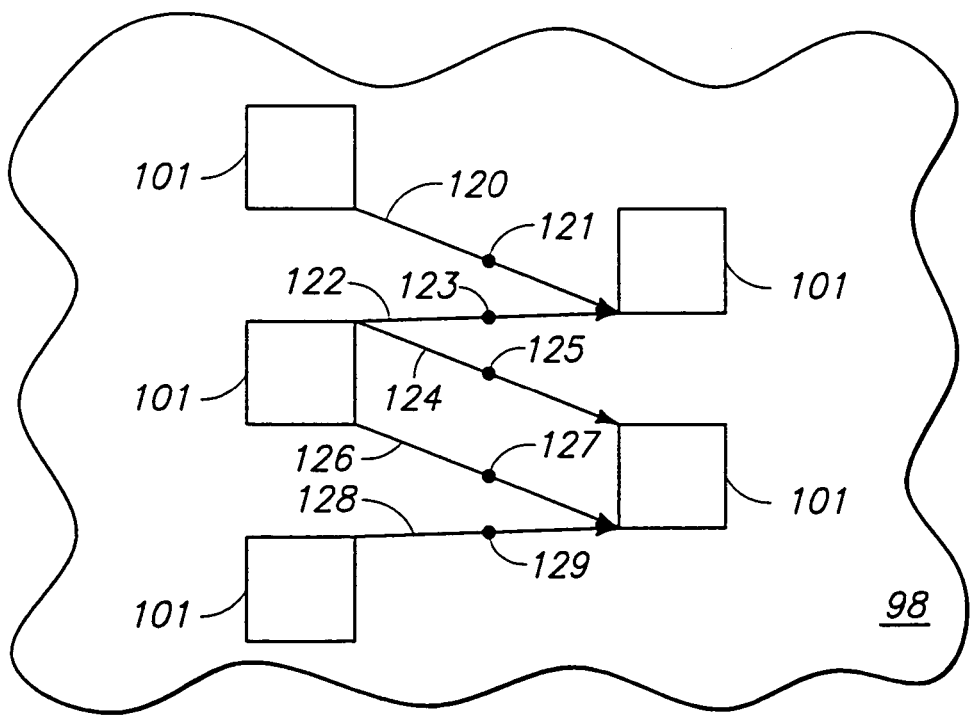
FIG. 12 is a diagrammatic top view of a mathematical construction further illustrating a process of the present invention for determining placement of sidelobe inhibitors.
Figure 13:
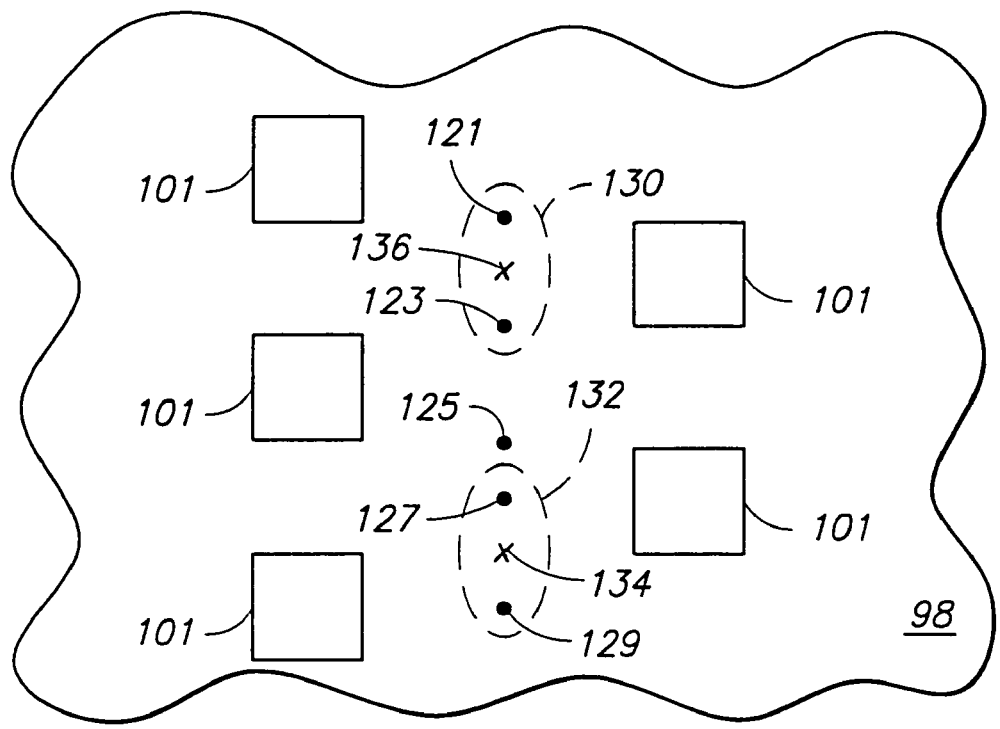
FIG. 13 is a diagrammatic top view of the mathematical construction of FIG. 12 at a processing stage subsequent to that of FIG. 12, and further illustrating a process of the present invention for determining location of sidelobe inhibitors.
Figure 14:
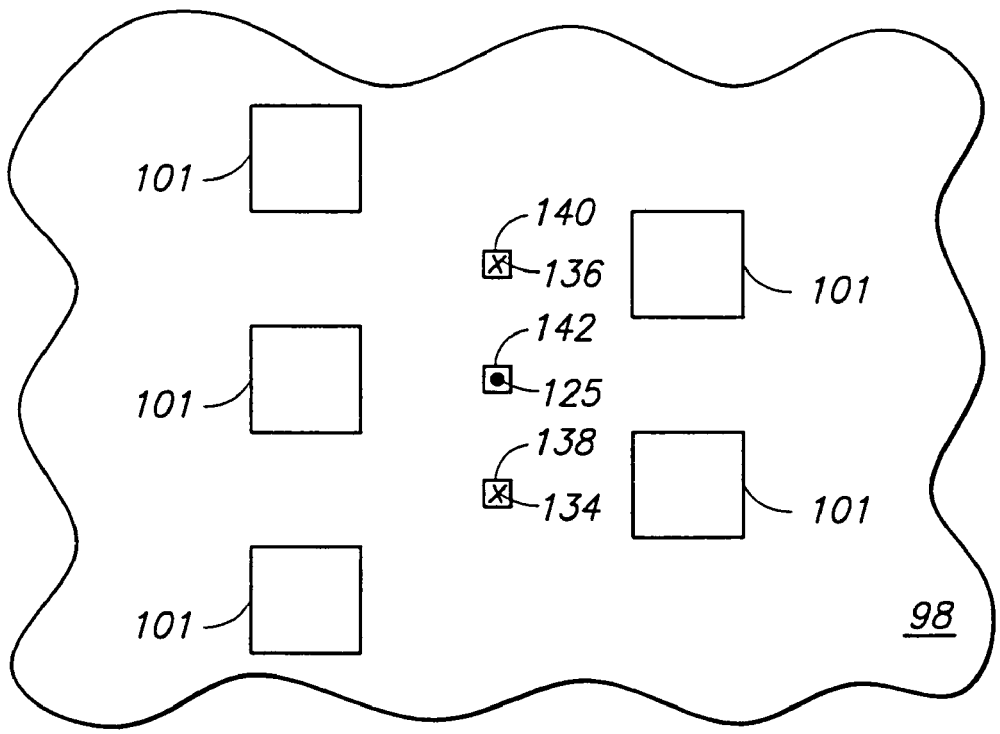
FIG. 14 is a diagrammatic top view of the mathematical construction of FIG. 12 at a processing stage subsequent to that of FIG. 13, and further illustrating a process of the present invention for determining location of sidelobe inhibitors.

FIGS. 12-14 illustrate further methods for determining locations of sidelobe interaction, and ultimately locations for placement of sidelobe inhibitors on a radiation-patterning tool. The numbering of FIGS. 12-14 will be identical to that utilized in FIG. 11, where appropriate.

FIG. 12 illustrates a mathematical construct 98 having design features 101. The design features are all within a threshold spatial distance of one another, so vectors are generated extending between all of the various design features. The vectors are labeled as 120, 122, 124, 126 and 128. Such vectors have midpoints at locations 121, 123, 125, 127 and 129.

FIG. 13 illustrates mathematical construct 98 at a stage subsequent to FIG. 12, and shows the midpoints 121, 123, 127, 127 and 129. Regions 130 and 132 designate threshold distances for determining convergence of vector midpoints. Region 130 comprises midpoints 121 and 123, and region 132 comprises midpoints 127 and 129. A single sidelobe inhibitor is typically formed for any given location having converging vector midpoints therein, and the sidelobe inhibitor is typically formed over an averaged location of the converging vector midpoints. An averaged location of midpoints 121 and 123 within region 130 is shown as 136, and an averaged location of midpoints 127 and 129 within region 132 is shown as 134. Locations 134 and 136 are approximations to locations where problematic sidelobe interactions may occur.

FIG. 14 illustrates mathematical construct 98 at a stage subsequent to FIG. 13, and shows regions 140, 142 and 138 where sidelobe inhibitors are calculated to be desired to inhibit problematic sidelobe interactions. Regions 140 and 138 are centered around the locations 136 and 134, respectively, determined as averaged locations of converging vector midpoints within a threshold distance of one another. Region 142 is centered over midpoint 125, which was not within a converging distance of another midpoint.

Regions 140, 142 and 138 can be shifted to the real domain during taping of features from construct 98 onto a radiation-patterning tool, and at such time sidelobe inhibitors can be formed across the portions of the tool corresponding to the regions to prevent undesired interaction of the sidelobes which would otherwise occur during printing with the radiation-patterning tool.

The embodiments of FIGS. 11-14 illustrate that the edges utilized for generation of vectors in methodology of the present invention are typically the edges of adjacent design features which are nearest one another. In particular aspects, the vectors can be generated from vertices (or corners) of adjacent design features, and can extend from corner-to-corner exclusively. In other aspects, the vectors can extend from edge-to-edge of design features, and in yet other aspects the vectors can extend from both corner-to-corner and edge-to-edge of design features.

Figure 10:
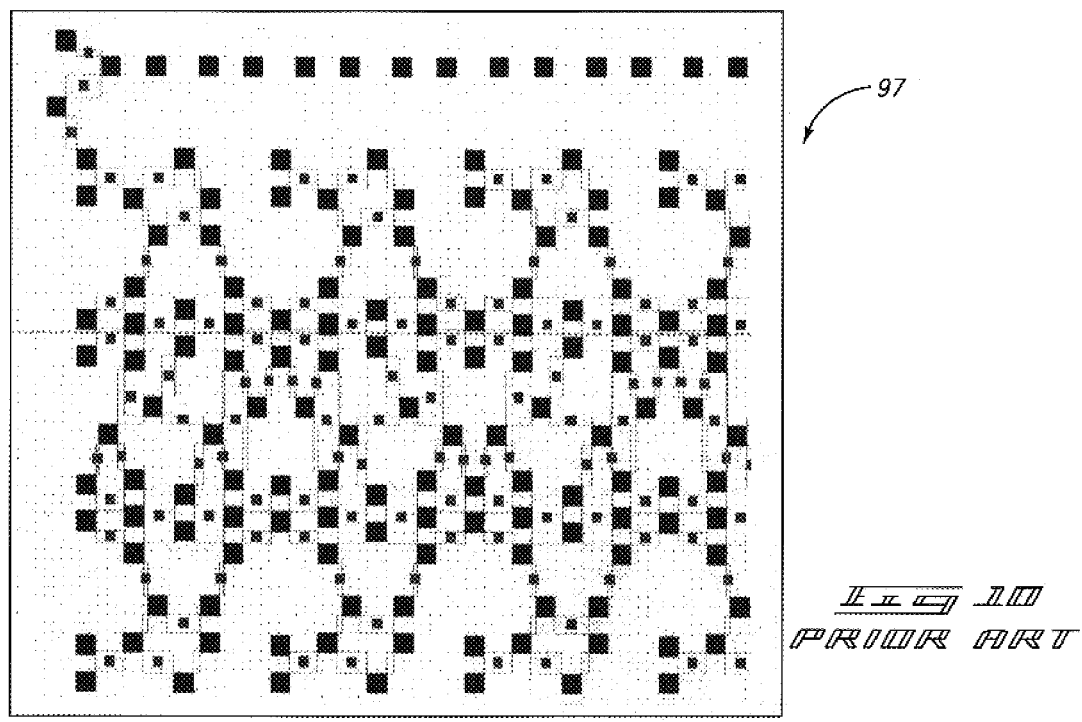
FIG. 10 is a color drawing diagrammatically illustrating a mathematical construction for determining locations of sidelobe inhibitors in accordance with a prior art process.
Figure 15:
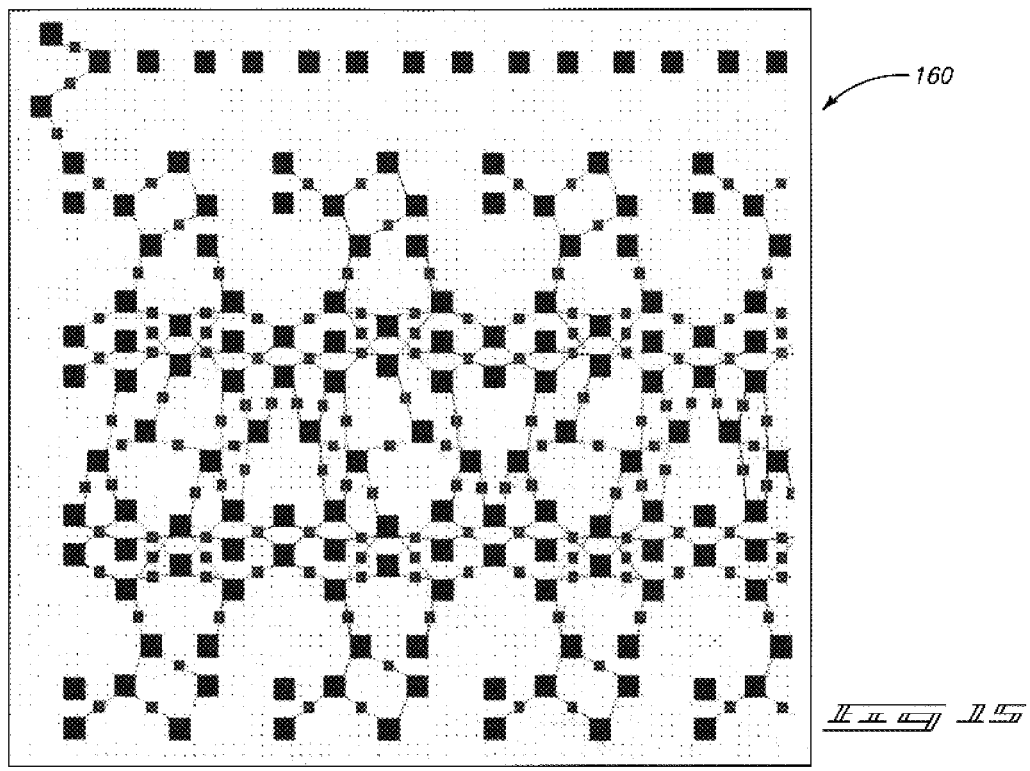
FIG. 15 is a color drawing diagrammatically illustrating a mathematical construction for determining locations of sidelobe inhibitors in accordance with methodology of the present invention.

FIGS. 15 and 16 are color drawings graphically illustrating various aspects of the present invention. FIG. 15 shows a mathematical construct 160 having identical design features as the construct 97 of FIG. 10. The elements are shown as blue squares, identically to the way the elements are illustrated in FIG. 10. Construct 160 also shows vectors as brown lines extending between elements, with such vectors having been calculated in accordance with methodology described above for the present invention. The threshold spatial distance corresponded to a corner-to-corner distance of 0.6 microns at the 1X level (i.e., printing level), and the threshold number of vector midpoints was two. Sidelobe inhibitor locations identified from the vectors are shown as red squares in construct 160. The vector method of the present invention has more accurately identified areas where sidelobe interactions will occur than did the prior art method described with reference to FIG. 10. Such is evidenced by FIG. 16, which shows a mathematical construct 190 illustrating differences between the construct 160 of FIG. 15 and the construct 97 of FIG. 10. Specifically, the design features (blue squares) of constructs 97 and 160 are shown in FIG. 16 together with locations of sidelobe inhibitors (purple squares and red squares). The purple squares correspond to sidelobe inhibitor locations which were identically identified in the mathematical construct 97 of the prior art, and the construct 160 of the present invention. Red squares show sidelobe inhibitor locations identified by the vector method of the present invention (i.e., present in construct 160 of FIG. 15), which were not identified by the methodology of the prior art (which are not present in construct 97 of FIG. 10). Small blue squares show sidelobe inhibitor locations identified by the prior art method of FIG. 10 which are not present in the construct 160 of FIG. 15. It is noted that such sidelobe inhibitor locations are generally misidentified by the prior art methodology, and one of the aspects of the present invention is to more correctly identify the appropriate placement for such sidelobe inhibitor locations. Exemplary regions 192 and 194 are shown in construct 190 to show regions where methodology of the present invention has significant improved over the prior art methodology of FIG. 10.

The invention encompasses computer readable code that can enable a computer to determine locations for placement of sidelobe inhibitors. The code can be, for example, on a computer readable media or in a carrier wave. Examples of computer readable media are floppy disks, storage tapes, hard drive, RAM and ROM. Examples of carrier waves are internet communications. The computer readable code can be configured to not only determine locations for sidelobe inhibitors, but also to control a taping operation and thereby control placement of the sidelobe inhibitors on a radiation-patterning tool.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a reticle, comprising:
   defining pattern features of the reticle, and determining a threshold distance between pattern features that can lead to sidelobe overlap;
   determining which pattern features are within the threshold distance of one another;

calculating vectors describing the distance and direction between edges of the pattern features that are within the threshold spatial distance of one another;

utilizing the vectors to identify regions of the reticle where sidelobe overlap can occur; and forming sidelobe inhibitors across at least some of the identified regions of the reticle.

2. The method of claim 1 wherein edges utilized to calculate the vectors are nearest edges of the pattern features which are within the threshold distance.

3. The method of claim 1 wherein a predetermined wavelength of light will be passed through the reticle to create a pattern in a photo-imageable material, and wherein the threshold distance is from about one-half of the predetermined wavelength to about equal to the predetermined wavelength.

4. The method of claim 3 wherein the sidelobe inhibitors have maximum dimensions of about one-half of the predetermined wavelength.

5. The method of claim 1 wherein at least some of the pattern features are polygonal, and wherein at least some of the vectors extend from a corner of one pattern feature to a corner of another pattern feature.

6. The method of claim 1 wherein at least some of the pattern features are rectangular, and wherein at least some of the vectors extend from a corner of one pattern feature to a corner of another pattern feature.

7. A method for placement of sidelobe inhibitors on a photopatterning tool, comprising:

defining pattern features of the tool, and determining a threshold distance between pattern features that can lead to sidelobe overlap;

determining which pattern features are within the threshold distance of one another;

calculating vectors describing the distance and direction between edges of the pattern features that are within the threshold distance of one another;

identifying first locations corresponding to midpoints of the vectors;

identifying regions where a threshold number of midpoints converge to within an overlap distance; and utilizing at least some of the identified regions during formation of sidelobe inhibitors on the tool.

8. The method of claim 7 wherein edges utilized to calculate the vectors are nearest edges of the pattern features which are within the threshold distance.

9. The method of claim 7 wherein a predetermined wavelength of light will be passed through the tool to create a pattern in a photo-imageable material, and wherein the threshold distance is from about one-half of the predetermined wavelength to about equal to the predetermined wavelength.

10. The method of claim 9 wherein the sidelobe inhibitors have maximum dimensions of about one-half of the predetermined wavelength.

11. The method of claim 9 wherein the overlap distance is less than or equal to about one-half of the predetermined wavelength.

12. A method of forming a reticle, comprising:

defining a pattern which is to be formed in a photo-imageable material by light passing through the reticle;

determining design features to approximate elements to include in the reticle to form the pattern;

determining a threshold distance between design features that can lead to sidelobe overlap;

calculating vectors spanning between edges of design features within the threshold distance of one another;

calculating locations where at least two vector midpoints converge to within a predetermined overlap distance;

after determining the locations, performing an optical proximity correction on the design features;

after the optical proximity correction, utilizing the design features during taping of actual elements onto the reticle; and forming sidelobe inhibitors over regions of the reticle identified using the calculated locations.

13. The method of claim 12 wherein the reticle comprises a layer of material substantially opaque to the light; wherein the actual elements are openings extending at least partially into the material substantially opaque to the light; and wherein the sidewall inhibitors are openings extending at least partially into the material substantially opaque to the light.

* * * * *